(12) United States Patent
Van Haren et al.

(10) Patent No.: US 7,863,763 B2
(45) Date of Patent: Jan. 4, 2011

(54) BINARY SINUSOIDAL SUB-WAVELENGTH GRATINGS AS ALIGNMENT MARKS

(75) Inventors: Richard Johannes Franciscus Van Haren, Waalre (NL); Sami Musa, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 1033 days.

(21) Appl. No.: 11/284,407

(22) Filed: Nov. 22, 2005

(65) Prior Publication Data

US 2007/0114678 A1 May 24, 2007

(51) Int. Cl.
H01L 23/544 (2006.01)

(52) U.S. Cl. .............. 257/797; 438/462; 438/463; 356/496; 356/498; 356/485

(58) Field of Classification Search .............. 257/797; 398/79, 48, 187; 438/462, 463; 356/496, 356/498, 485
See application file for complete search history.

(56) References Cited

U.S. PATENT DOCUMENTS

| 4,631,416 | A | 12/1986 | Trutna, Jr. .............. 250/548 |
| 6,522,411 | B1 | 2/2003 | Moon et al. |
| 6,844,918 | B2 | 1/2005 | Koren et al. |
| 6,876,092 | B2 | 4/2005 | Ballarin |
| 6,970,649 | B2 * | 11/2005 | DeCusatis et al. .............. 398/79 |
| 7,466,413 | B2 * | 12/2008 | Finders et al. .............. 356/401 |

| 2003/0021466 | A1 | 1/2003 | Adel et al. |
| 2004/0075179 | A1 * | 4/2004 | Liu et al. .............. 257/797 |
| 2005/0189502 | A1 * | 9/2005 | Van Bilsen et al. .............. 250/559.3 |

FOREIGN PATENT DOCUMENTS

| EP | 0 997 782 A1 | 5/2000 |
| EP | 1 260 869 A1 | 11/2002 |
| EP | 1 260 870 A1 | 11/2002 |
| GB | 2183364 | 6/1987 |
| JP | 2004-508711 T | 3/2004 |
| JP | 2004-134474 A | 4/2004 |
| JP | 2005031681 A | 2/2005 |
| WO | 0219415 A1 | 8/2001 |

OTHER PUBLICATIONS

M. Collischon et al., "Optimized artificial index gratings", Infrared Phys. Technol. 36, pp. 915-921 (1995).
Philippe Lalanne et al., "Antireflection behavior of silicon subwavelength periodic structures fir visible light", Nanotechnology 8, pp. 53-56 (1997).
Translation of foreign Office Action mailed Sep. 3, 2009 in related patent application No. JP2006/308751.

* cited by examiner

Primary Examiner—Thao X Le
Assistant Examiner—Thanh Y Tran
(74) Attorney, Agent, or Firm—Pillsbury Winthrop Shaw Pittman LLP

(57) ABSTRACT

The present invention relates to alignment marks for use on substrates, the alignment marks consisting of periodic 2-dimensional arrays of structures, the spacing of the structures being smaller than an alignment beam but larger than an exposure beam and the width of the structures varying sinusoidally from one end of an array to the other.

13 Claims, 2 Drawing Sheets

BINARY SINUSOIDAL SUB-WAVELENGTH GRATINGS AS ALIGNMENT MARKS

FIELD OF THE INVENTION

The present invention relates to an alignment method and substrate, particularly a method and substrate for use in a lithographic apparatus.

BACKGROUND OF THE INVENTION

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The pattern is transferred onto several successive resist layers on the substrate in order to build up a multi-layer structure with the pattern throughout its thickness. It is therefore important to ensure that the pattern in any given layer is exactly aligned with the pattern in the previous layer. The way that successive patterned layers are aligned is by having alignment marks in the layer, these alignment marks being detectable by an alignment beam that is projected by the projection system before the exposure beam is projected to apply the pattern. In order to leave as much space as possible on the substrate for the exposed pattern, the alignment marks are positioned in scribe lanes, which is the part of the substrate that will be sawn to separate the substrate into individual ICs, for example. Alignment marks have, in the past, taken the form of stacked (in several or all the layers) copper areas alternating with dielectric areas.

As lithographic techniques improve and smaller pattern lines are possible, the number and density of active components (e.g. memory cells in ICs) increases. The use of relatively large copper areas in the alignment marks in the scribe lanes means that the size of the scribe lanes is difficult to decrease and so inefficient use of substrate space is inevitable. The scribe lanes therefore consume space on the substrate that could be more efficiently used for active, useful devices, rather than for alignment marks and/or test structures. Alignment marks that are used in the state of the art contain large structures (i.e. large compared to the typical device dimensions). For processing reasons, the alignment mark should resemble the device/product dimensions to guarantee alignment accuracy. Therefore, a sub-segmentation is added to the large areas (e.g. structures 10 in FIG. 2) inside the mark. The typical dimensions of the sub-segmentation can be around or larger than the wavelength of the alignment beam. This can make the areas 10 transparent for the wavelength of the alignment beam; i.e. so that the alignment beam cannot sense the structures and therefore not be used for alignment.

A known alignment system employs an alignment beam of radiation that is radiated by a separate alignment unit and that is incident on a mark, in the form of a grating, on the substrate. The grating diffracts the alignment beam into a number of sub-beams extending at different angles to the normal of the grating. The distinct sub-beams will be directed with a lens of the alignment unit to different positions in a plane. In this plane, structure may be provided for further separating the different sub-beams. The lens system will also be used to finally image the different sub-beams on a reference plate to create an image of the mark. In this reference plate, a reference mark can be provided and a radiation sensitive detector can be arranged behind the reference mark. The output signal of the detector will be dependent on the extent to which the image of the substrate mark and the reference mark coincide. In this way the extent of alignment of the mark on the substrate with the reference mark in the alignment unit can be measured and optimized. The detector may comprise separate individual detectors for measuring the intensity and the aligned position at different orders. To finish the alignment, the reference in the alignment unit has to be aligned to a second reference mark, for example, one provided to the substrate table with the alignment unit. This second reference mark may then be aligned to a mark in the mask using exposure light.

An alternative alignment system is a direct on-axis alignment system that directs an alignment beam directly upon a mark provided on the substrate via the projection system. This beam will be diffracted by the mark on the substrate into different sub-beams and will be reflected into the projection system. After traversing the projection system the different sub-beams will be focussed on a reference alignment mark provided to the mask. The image of the substrate mark formed by the sub-beams can be imaged upon the reference mark in the mask. In this way the extent of alignment of the mark on the substrate and the reference mark in the mask can be measured and optimized. This can be done by using a radiation sensitive detector constructed and arranged to detect the alignment beam traversing the mark in the mask.

Descriptions of these two types of alignment can be found in EP 1 260 870, which is incorporated herein by reference.

Existing alignment marks are formed on a substantially larger scale than the features imaged on the substrate. For example, a box-in-box type marker may have a size of 10 µm or more whereas the minimum dimension of features imaged on the substrate may be 0.1 µm. Thus, when the alignment marks are projected onto the substrate, the light diffracted by the alignment marks in the mask pattern will travel along different paths through the projection optics than light diffracted by the patterned features. The images of the alignment marks will therefore be subject to different aberrations than the images of the mask features and positional errors in the alignment marks may therefore not be the same as the positional errors in the patterned features. This imposes a limit on the accuracy with which overlay errors can be determined. EP 0 997 782 proposes a solution to this problem whereby the alignment mark is formed as a grating having similar line, width and spacings as those of the circuit pattern. Alignment is performed using a television camera image of the alignment mark on the substrate. However, the alignment mark proposed in EP 0 997 782 only exhibits the same positional errors as patterns of adjacent lines and does not provide improved accuracy in measurement of overlay errors for other types of pattern. Furthermore, the alignment mark requires an additional arrangement for determination of its position and is not compatible with existing alignment systems.

A further solution is proposed in EP 1 260 869, which discloses a substrate provided with an alignment mark in a substantially transmissive process layer overlying the substrate, said mark comprising at least one relatively high reflectance area for reflecting radiation of an alignment beam of radiation, and relatively low reflectance areas for reflecting less radiation of the alignment beam; wherein the high reflectance area is segmented in first and second directions, both directions being substantially perpendicular with respect to each other so that the high reflectance areas comprise predominantly rectangular segments.

By segmenting the relatively high reflectance areas of the alignment mark into rectangular sub-divisions, the mark can be arranged to diffract light into similar positions in the pupil plane of the projection lens as structures in the mask pattern. The image of the alignment mark projected onto the wafer will therefore suffer from the same aberrations as the image of the structures of the mask pattern and thus the position of the mark on the substrate is represented by the position of patterned features. Because each part of the high reflectance area is segmented in two directions into rectangular pieces, the whole mark experiences the same aberrations.

However, generally speaking, the intensity of diffracted radiation is distributed over many orders and not all diffraction orders are used for alignment. Using sub-divisions with a feature size larger than the illumination wavelength means that, because many diffraction orders are created, part of the incident light is diffracted to undesired higher orders. Optimizing the intensity in one of the higher orders may imply a decrease of the intensity in the first order. The first order is used during the coarse wafer alignment. Low signal strength in the first order may result in large aligned position errors.

This results in poor wafer quality for the diffraction orders that are used in the alignment by the alignment wavelength. Furthermore, the alignment marks or gratings are placed in separate positions on the wafers, which results in the diffracted signal being influenced by their different environments and different phase depths. This has been shown to lead to a shift in the signal of up to 8 microns, which is a large error on the sub-divided marks that have a period of the order of a few tens of microns.

A further disadvantage with these types of marks is that they each have to be scanned separately prior to alignment. This gives a low throughput of wafers.

SUMMARY OF THE INVENTION

It is desirable to create an alignment mark on a substrate that will allow more efficient use of the space on a substrate as well as being quick to create prior to the alignment process and efficient to use during the alignment process. It is also desirable to optimize the intensity of the diffracted radiation in useful orders, such as the first diffraction order that is used for alignment.

According to an aspect of the invention, there is provided a substrate having provided thereon an alignment mark comprising a periodic array of structures, the array having a first and second end;

the structures being separated by a distance that is less than the wavelength of an alignment radiation beam; and wherein the width of the structures varies within a period such that a local phase (proportional to the effective refractive index) within the period varies sinusoidally from the first end of the array to the second end.

According to a second aspect of the invention, there is provided a mask containing a pattern for exposing an alignment mark, the alignment mark comprising a periodic array of structures, the array having a first and second end;

the structures being separated by a distance that is less than the wavelength of an alignment radiation beam; and wherein the width of the structures varies within a period such that a local phase (proportional to the effective refractive index) within the period varies sinusoidally from the first end of the array to the second end.

According to another aspect of the present invention, there is provided an inspection method for inspecting the alignment of a pattern on a substrate, comprising:

providing a periodic sinusoidal array of reflective structures on a substrate;

illuminating the array with an alignment radiation beam comprising a wavelength that is greater than the distance between the structures;

detecting the reflected alignment radiation beam; and determining, from the properties of the reflected beam, whether the array is in alignment with the pattern.

According to yet another aspect of the present invention, there is provided a method for creating an alignment mark on a substrate, comprising:

depositing, onto the substrate, a layer containing a periodic array of structures, the array having a periodic variation in refractive index, and the spacing between the structures being smaller than the wavelength of an intended alignment beam and the width of the structures varying within a period such that a local phase (proportional to the effective refractive index) varies sinusoidally from a first end of the array to the other.

According to a final aspect of the present invention, there is provided a device manufacturing method comprising projecting a patterned beam of radiation onto a substrate, wherein the substrate contains an alignment mark made of a periodic array of structures, the distance between the structures being smaller than the wavelength of an alignment beam (but larger than the wavelength of the patterned beam) and the width of adjacent structures varies within a period such that a local phase (proportional to the effective refractive index) within the period varies sinusoidally from a first end of the array to the a second end.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
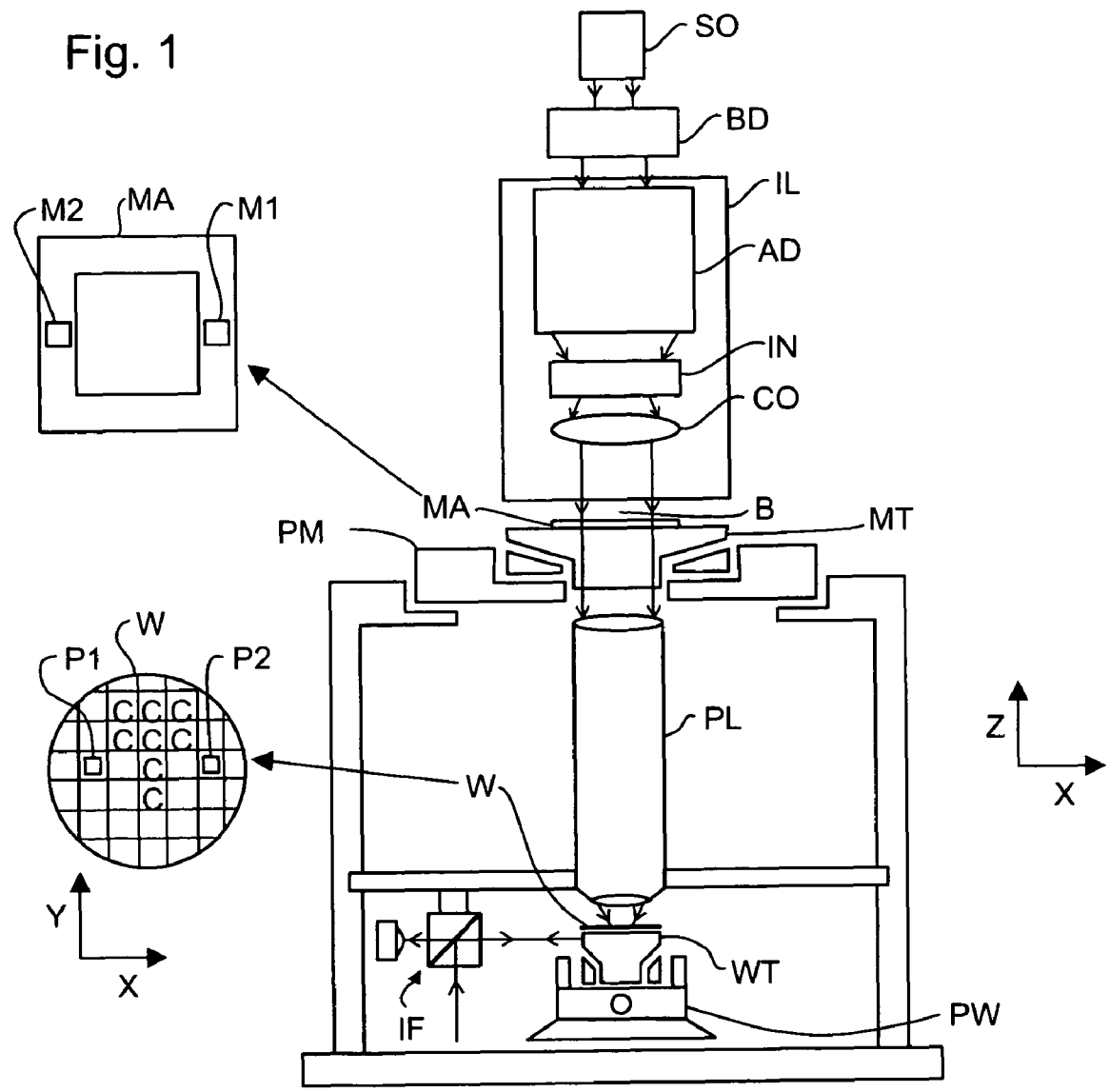
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or visible light radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2.

Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

For alignment purposes the mask is provided with marks ($M_1$ and $M_2$) in the mask MA. These marks ($M_1$ and $M_2$) may be aligned directly or indirectly through the projection system PL to marks ($P_1$ and $P_2$) in the substrate W. During this alignment, information will be obtained about the position of the image C projected through the projection system PL upon the substrate W. This is necessary to assure that different layers exposed with different masks are correctly positioned with respect to each other. It is therefore necessary that before exposure of each layer, the image in the mask MA is aligned to the same substrate marks ($P_1$ and $P_2$).

Radiation beams with different wavelengths are used in the present invention for the exposure wavelength and the alignment wavelength. The wavelength of the exposure radiation is smaller than the wavelength of the alignment radiation. An alignment wavelength may be infra-red or visible light, for example; close to or at 633 nm or in the range of 560-630 nm, more specifically; or radiation from an HeNe laser or Halogen lamp (i.e. any wavelength that will not affect the resist layers on the substrate), while an exposure wavelength is usually ultra-violet or similar.

Sub-wavelength periodic arrays of structures are created on the substrate, which are detectable by the alignment beam but do not affect the exposure beam. This means that the alignment mark may be created in the same parts of the wafer as the target area of the wafer without affecting the image.

Figure 2:
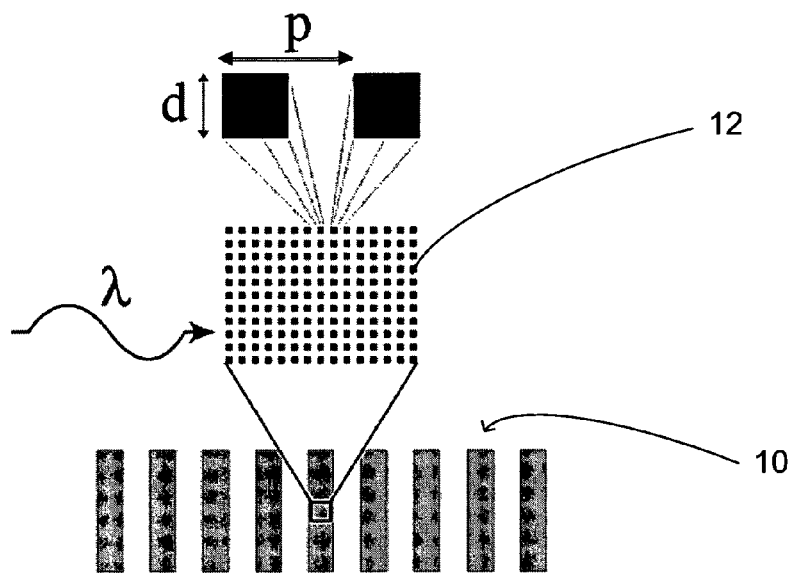
FIG. 2 depicts an alignment mark according to the present invention.

FIG. 2 shows an example of an alignment mark based on a two-dimensional photonic crystal. In this embodiment, the dark columns 10 are made up of 2-D arrays 12 of contact holes. A structure can be any repetitive feature that forms an artificial crystal for the wavelength of the alignment beam (1-D or 2-D). In practice, it is likely that the feature will be a contact hole. It may also be a "brick" like structure such as that used in deep trench applications. For instance, in a copper damascene process, arrays of holes are printed, etched in Silicon-Oxide and filled with copper. The redundant copper is polished away.

Both the feature size d and the pitch p of the array as shown in FIG. 2 are much smaller than the wavelengths of the alignment beam. Pitch p must be smaller than the wavelength of the alignment beam, whereas feature size d may optionally be smaller. By having these structures, or contact holes, smaller than the alignment beam wavelength, but larger than the exposure beam wavelength, artificial materials are created with controlled optical properties. The optical properties may be the real (refractivity or reflectivity) and imaginary (absorption) part of the effective refractive index. Artificial materials with controlled optical properties for the alignment wavelengths can be made by making use of lithographic techniques, i.e. when these alignment techniques are used in lithography, the lithographic apparatus itself may be used to create the alignment marks. By using structures (grating period) smaller than the wavelength of alignment beam, the incident light will not be able to resolve these features and therefore will see the structure as a homogenous medium. This homogenous medium will have an effective refractive index (both real and imaginary) that is dependant on the refractive indices of the materials making up the structure and the geometry of the structure (i.e. the period and duty cycle.)

The document "Optimized Artificial Index Gratings" on pages 915-921 of Infrared phys. technol. 36 (1995) by M. Collischon et al. describes artificial index gratings that are binary gratings consisting of minilattices of sub-wavelength microstructures. The document describes the use of a metallic or dielectric sub-wavelength grating that, due to its arrays of sub-wavelength microstructures, gives rise to the material containing the grating having an overall "effective" refractive index. This effective refractive index causes the microstructures to behave like material with distributed index. The benefit of this sort of structure is that the periodicity and duty cycle of the structure can be made so that, dependent on the incident alignment wavelength, only the zeroth diffraction order is detectable and the rest of the diffraction orders are evanescent. In this way, all the incident energy can be transmitted or reflected in the zeroth order with almost 100% efficiency. By changing the duty cycle of the sub-segments or microstructures, the local phase within the grating period can be controlled and consequently, the direction of the light transmitted or reflected from the grating can be varied. This means that detectors may be placed in more useful positions.

Figure 3:
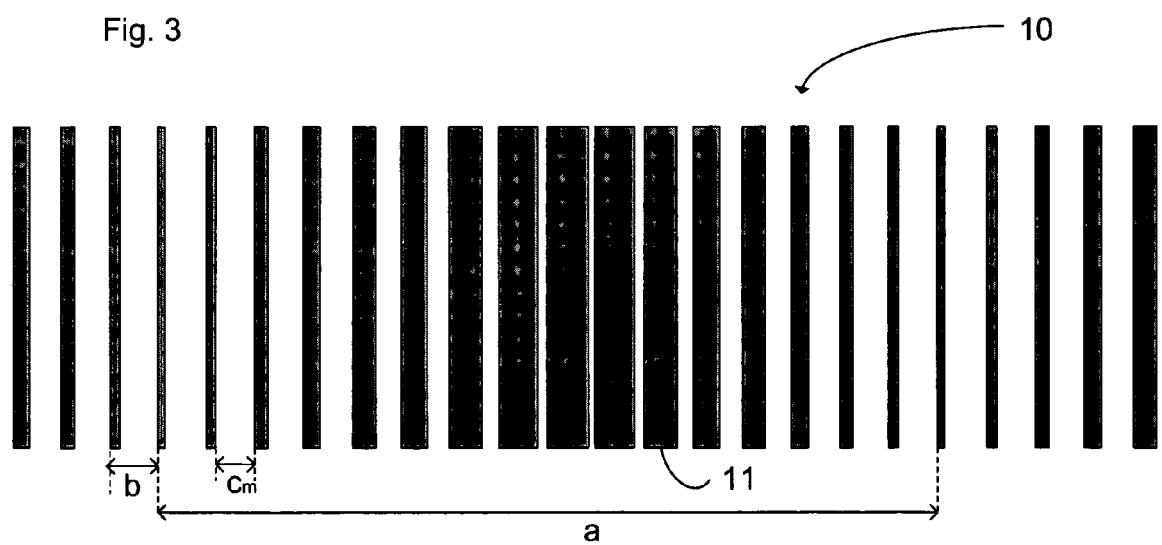
FIG. 3 depicts a more detailed view of the alignment mark according to the invention.

FIG. 3 shows an example of the organization of the structures in the grating according to the present invention. The size of the structures 11 varies sinusoidally from one end of the array of structures to the other (i.e. the phase, which is proportional to the refractive index of the structures varies from one end of the array to the other). However, the distance from the left edge of one structure to the left edge of the next structure (the pitch) is constant and is labeled as a distance b. The grating period (i.e. from a minimum to a maximum of the sinusoidal period) is labeled as a and the varying distance between the structures 11 is labeled as $c_m$, where m is the number of the individual structure 11.

The duty cycle, $t_m$, is defined as:

$$t_m = (b - c_m)/b.$$

By varying the duty cycle $t_m$ of the sub-segments so as to create a sinusoidally varying local phase within the grating period, a sinusoidal grating is created using only binary subwavelengths structures and all the incident light will be reflected into the single order that is characteristic to the respective sinusoidal grating.

The "sinusoidal" alignment mark as described in the present invention concentrates all the incident energy into a single diffraction order. Two "sinusoidal" alignment gratings are needed during the coarse wafer alignment phase. One alignment segment is based on a 16-µm periodicity; the other has a 17.6-µm periodicity. In principle, these gratings can be integrated into a single alignment grating generating two diffraction orders only; one originating from the underlying 16-µm periodicity, the other from the 17.6-µm periodicity. All the incident energy is thereby put into the relevant orders.

In other words, by super-positioning of two or more of such sinusoidal gratings 10 with different periodicities a, light can be directed exclusively into the diffraction orders that are desired for the relevant alignment. The relevant alignment will be dependent on the alignment radiation wavelength, which will in turn be dependent on the exposure wavelength and the features being aligned. This has the advantage of an enhanced signal because no radiation is coupled into undesired diffraction orders, as is the problem with the existing art.

Furthermore, a binary sub-wavelength grating as described above can also be used to make an efficient mark for capturing. Capturing is carried out by scanning two gratings with specifically chosen but different periodicities placed next to each other. By processing of the signal obtained from the grating during this scan, the position of the substrate can be determined. By the super-positioning, for instance, of 16 micron and 17.6 micron period gratings, two marks can be combined in one grating and scanned simultaneously. The diffraction orders of the two gratings can be separated by wedges and detected separately. This simultaneous scan of the combined gratings will result in an increased throughput as compared to the scan of the separate gratings in the prior art.

The alignment marks according to the present invention have the advantage of an optimized grating efficiency and thereby significant improvement of the substrate qualities. The alignment marks are used particularly well in floating or stack marks floating above silicon oxide as these marks can prevent radiation from passing through the layers to lower layers and avoid unwanted reflection from the lower layers. This is because these marks are metallic sub-wavelength gratings, which are known to function as wire grids that work as polarization filters. A wire grid has the characteristic that it totally reflects an incident beam that has electric field component parallel to the grating grooves while it lets through a light beam that has its electrical field perpendicular to the groove. Thus, if the incident beam is a TE polarized light (with the electrical field parallel to the groove of the grating), no light will pass through the grating and thus no unwanted reflection of lower layers will occur. In the prior art, capturing is carried out by scanning over two separate gratings. These gratings may have a different phase depth. Each of these grating may be surrounded by different environments (e.g. structures) that can influence the signals originating from them and consequently result in measurement error. In the present invention, the two gratings are combined in one grating and thus the possibility for the measurement error introduced by the different environments is eliminated.

Another term for these periodic two-D arrays is "artificial crystals". The microscopic optical properties of these crystals, for example the effective real and imaginary part of the refractive index (the "effective index") can be controlled accurately by the duty cycle $t_m$ and the periodicity a of the arrays. The microscopic optical properties of the substrate may therefore be tailored for the alignment wavelength thanks to the microscopic optical properties.

The alignment marks can also be applied to other process layers, such as a deep trench layer, local inter-connect layers, etc. The periodic 2-D arrays can be applied in alignment marks but also as anti-reflection layers.

These photonic crystal alignment marks in substrates may also be known as subwavelength surfaces that are etched into silicon substrates and exhibit antireflection characteristics. They may be made by holographically recording a crossed-grating in a photoresist mask followed by reactive-ion etching to transfer the priomary mask onto the substrate (e.g. using the exposure beam). More information on how this sort of structure may be made may be found in "Antireflection behaviour of silicon subwavelength periodic structures for visible light", Lalanne and Morris, Nanotechnology 8 (1997) 53-56.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A substrate having provided thereon an alignment mark comprising:
    a periodic array of structures, the array of structures having a first end and a second end; and
    the array of structures having a pitch that is less than the wavelength of an alignment radiation beam,
    wherein a width of the array of structures varies within a period such that a local phase varies sinusoidally from the first end of the array of structures to the second end.

2. A substrate according to claim 1, wherein a duty cycle of the array of structures varies such that a grating has a sinusoidally varying local phase from one end of the array of structures to the other and wherein the duty cycle is defined as $(b-c_m)/b$, where $c_m$ is the distance between adjacent structures m and m+1, and b is the sub-wavelength period.

3. A substrate according to claim 1, wherein the periodicity of the array is constant.

4. A substrate according to claim 1, further comprising a second array of structures with a different periodicity than the first array of structures, the second array of structures being overlain on the first array of structures to enable measurement of their relative alignment.

5. A substrate according to claim 4, wherein the first array of structures has a period of 16 microns and the second array of structures has a period of 17.6 microns.

6. A substrate according to claim 1, wherein the alignment mark is applied to one or more resist layers on the substrate.

7. A substrate according to claim 1, wherein the alignment mark is applied to a deep trench layer.

8. A substrate according to claim 1, wherein the alignment mark is applied to a process layer in a lithographic apparatus.

9. A substrate according to claim 1, wherein a duty cycle and periodicity of the periodic array of structures affects the real and imaginary parts of the refractive index of a material containing the periodic array.

10. An alignment measuring system for measuring an alignment of a pattern with a substrate on which the pattern is to be exposed, comprising:
    a substrate having provided thereon an alignment mark comprising two periodic arrays of structures, the second array being overlain on the first array,
    the arrays of structures each having a first end and a second end; and
    the array of structures being at a pitch that is less than the wavelength of an alignment radiation beam,
    wherein a width of the array of structures varies within a period such that a local phase varies sinusoidally from the first end of the array of structures to the second end, and the arrays of structures have different periodicities,
    wherein the system comprises:
        illumination means for illuminating the arrays of structures;
        a wedge for separating the diffraction orders of the combined diffracted radiation of the two arrays of structures; and
        a detector for measuring the separated diffraction orders of the arrays.

11. A mask containing a pattern for exposing an alignment mark, the alignment mark comprising:
    a periodic array of structures, the array having a first end and a second end;
    the array of structures being separated by a distance that is less than a wavelength of an alignment radiation beam; and
    wherein a width of the array of structures varies within a period such that a local phase varies sinusoidally from the first end of the array of structures to the second end.

12. A device manufacturing method comprising projecting a patterned beam of radiation onto a substrate, wherein the substrate contains an alignment mark made of a periodic array of structures, the array of structures having a first end and a second end, a distance between the array of structures being smaller than a wavelength of an alignment beam, and a width of adjacent structures varying within a period such that a local phase varies sinusoidally from said first end of the array of structures to said second end.

13. A device manufactured according to the method of claim 12.

* * * * *